United States Patent
Li et al.

(10) Patent No.: US 11,870,434 B2
(45) Date of Patent: Jan. 9, 2024

(54) DRIVING CIRCUIT, DRIVING IC, AND DRIVING SYSTEM

(71) Applicant: GUANGDONG ZHINENG TECHNOLOGY CO., LTD., Guangdong (CN)

(72) Inventors: Zilan Li, Guangdong (CN); Shuxin Zhang, Guangdong (CN); Kan Chen, Guangdong (CN)

(73) Assignee: GUANGDONG ZHINENG TECHNOLOGY CO., LTD., Guangdong (CN)

( * ) Notice: Subject to any disclaimer, the term of this patent is extended or adjusted under 35 U.S.C. 154(b) by 92 days.

(21) Appl. No.: 17/594,844

(22) PCT Filed: Mar. 3, 2021

(86) PCT No.: PCT/CN2021/078961
§ 371 (c)(1),
(2) Date: Nov. 1, 2021

(87) PCT Pub. No.: WO2021/218372
PCT Pub. Date: Nov. 4, 2021

(65) Prior Publication Data
US 2023/0077458 A1    Mar. 16, 2023

(30) Foreign Application Priority Data
Apr. 29, 2020   (CN) .......................... 202010358117.2

(51) Int. Cl.
*H03K 17/687*   (2006.01)
*H01L 29/20*    (2006.01)
*H01L 29/778*   (2006.01)

(52) U.S. Cl.
CPC ..... *H03K 17/6872* (2013.01); *H01L 29/2003* (2013.01); *H01L 29/7789* (2013.01); *H03K 2217/0036* (2013.01)

(58) Field of Classification Search
CPC ........ H03K 17/6872; H03K 2217/0036; H01L 29/2003; H01L 29/7789; H01L 27/092;
(Continued)

(56) References Cited

U.S. PATENT DOCUMENTS

2003/0112042 A1* 6/2003 Takahashi ...... H03K 19/018585
327/112
2014/0091839 A1   4/2014 Peters et al.
(Continued)

FOREIGN PATENT DOCUMENTS

CN         1914786 A      2/2007
CN       202094816 U     12/2011
(Continued)

OTHER PUBLICATIONS

International Search Report and Written Opinion for International application No. PCT/CN2021/078961, dated May 21, 2021, ISA/CN.

(Continued)

*Primary Examiner* — Jung Kim
(74) *Attorney, Agent, or Firm* — ArentFox Schiff LLP

(57) ABSTRACT

The present disclosure provides a driving circuit, a driving IC, and a driving system, relating to the technical field of electronic circuits. The driving circuit comprises a control module and a driving signal output module, the control module is electrically connected to the driving signal output module, and the driving signal output module is configured to be electrically connected to a to-be-driven device, wherein the driving signal output module comprises at least two transistors, and the at least two transistors are epitaxially (Continued)

grown on the same substrate; and the control module is configured to control a closed state of the at least two transistors, so as to control an operation state of the to-be-driven device.

16 Claims, 10 Drawing Sheets

(58) Field of Classification Search
CPC ............... H01L 27/0605; H01L 27/085; H01L 29/0657; H01L 29/66462; H01L 29/7788; H01L 21/8252
See application file for complete search history.

(56) References Cited

U.S. PATENT DOCUMENTS

| | | |
|---|---|---|
| 2015/0303290 A1 | 10/2015 | Ueno |
| 2017/0070199 A1 | 3/2017 | Anderson et al. |
| 2017/0222047 A1 | 8/2017 | Conway et al. |
| 2018/0026628 A1 | 1/2018 | Lu et al. |
| 2018/0109250 A1 | 4/2018 | Shah et al. |
| 2018/0375509 A1 | 12/2018 | Akiyama et al. |
| 2020/0105762 A1* | 4/2020 | Xiao ............... H01L 21/823807 |
| 2020/0127552 A1 | 4/2020 | Frank et al. |

FOREIGN PATENT DOCUMENTS

| | | |
|---|---|---|
| CN | 103986314 A | 8/2014 |
| CN | 104377201 A | 2/2015 |
| CN | 106057800 A | 10/2016 |
| CN | 107017253 A | 8/2017 |
| CN | 110224019 A | 9/2019 |
| CN | 110970432 A | 4/2020 |
| CN | 111082791 A | 4/2020 |
| EP | 2838113 A | 2/2015 |
| JP | 201947006 A | 3/2019 |

OTHER PUBLICATIONS

European Search Report for EP 05775056, corresponding EP application of CN 1914786A, dated Jul. 5, 2007, EPO.

Office action dated Jun. 29, 2022 for corresponding European patent application No. 217831270, EPO.

Seidel, Achim et al., "Integrated Gate Drivers Based on High-Voltage Energy Storing for GaN Transistors", IEEE Journal of Solid-State Circuits, IEEE, USA, vol. 53, No. 12, Dec. 2018 (Dec. 2018), pp. 3446-3454, XP0 11700996, ISSN: 0018-9200, DOI: 10.1109/JSSC.2018.2866948 [retrieved on Dec. 18, 2018].

* cited by examiner

DRIVING CIRCUIT, DRIVING IC, AND DRIVING SYSTEM

CROSS-REFERENCE TO RELATED APPLICATION

This application is a 371 U.S. national phase stage of PCT/CN2021/078961, filed Mar. 3, 2021, which claims priority to Chinese patent application No. 202010358117.2, filed Apr. 29, 2020, the contents of each of which are incorporated herein by reference in its entirety.

FIELD OF THE INVENTION

The present disclosure relates to the technical field of electronic circuits, and in particular, to a driving circuit, a driving IC, and a driving system.

BACKGROUND OF THE INVENTION

The types of fully-controlled semiconductor high-voltage power device include BJT (Bipolar Junction Transistor), IGBT (Insulated Gate Bipolar Transistor) and other power semiconductor devices, and current MOSFET (Metal Oxide Semiconductor Field Effect Transistor) devices, etc., and presently are rapidly evolving toward the third-generation semiconductor power devices GaN FET (Gallium Nitride) formed by group III nitride materials and so on.

In power electronic products, the driving circuit is an essential key part thereof for the use of the fully-controlled semiconductor high voltage power device, while the existing driving circuits generally have a larger volume and cannot effectively implement integration.

To sum up, the existing driving circuits have the problems of a larger volume and a lower integration level.

SUMMARY OF THE INVENTION

An objective of the present disclosure is to provide a driving circuit, a driving IC, and a driving system, so as to solve the problems that the driving circuits in the prior art have a larger volume and a lower integration level.

In order to achieve the above objective, a technical solution adopted in the present disclosure is as follows.

In a first aspect, the present disclosure provides a driving circuit, wherein the driving circuit includes a control module and a driving signal output module, the control module is electrically connected to the driving signal output module, and the driving signal output module is electrically connected to a to-be-driven device,
wherein the driving signal output module comprises at least two transistors, and the at least two transistors are epitaxially grown on the same substrate; and
the control module is configured to control a closed state of the at least two transistors, so as to control an operation state of the to-be-driven device.

In a second aspect, the present disclosure provides a driving IC, wherein the driving IC includes at least two transistors, and the at least two transistors are epitaxially grown on the same substrate.

In a third aspect, the present disclosure provides a driving system, wherein the driving system includes a to-be-driven device and the above driving circuit, and the driving circuit is electrically connected to the to-be-driven device, wherein the driving circuit is configured to control an operation state of the to-be-driven device, and the to-be-driven device includes a nitride device.

In order to make the above objectives, features, and advantages of the present disclosure clearer and more understandable, optional embodiments of the present disclosure are described in detail below with reference to the accompanying drawings.

BRIEF DESCRIPTION OF THE DRAWINGS

In order to more clearly illustrate technical solutions of the present disclosure, accompanying drawings which need to be used will be introduced briefly below, and it should be understood that the accompanying drawings below merely show some embodiments of the present disclosure, therefore, they should not be considered as limitation on the scope, and those ordinarily skilled in the art still could obtain other relevant drawings according to these accompanying drawings, without using any creative efforts.

Figure 1:
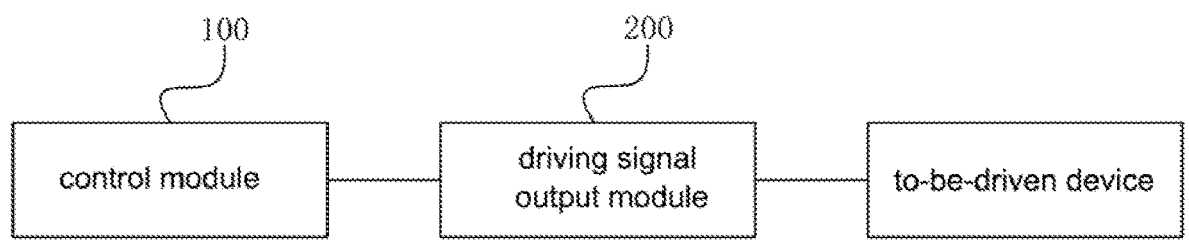
FIG. 1 is a module schematic diagram of a driving circuit provided in the present disclosure.

In the drawings: 100—control module; 200—driving signal output module.

DETAILED DESCRIPTION OF THE INVENTION

In order to make objectives, technical solutions, and advantages of the present disclosure clearer, the technical solutions in the present disclosure will be described clearly and completely below in conjunction with accompanying drawings in the present disclosure, and apparently, the implementations described are some but not all implementations of the present disclosure. Generally, components in the present disclosure, as described and shown in the accompanying drawings herein, may be arranged and designed in various different configurations.

Therefore, the detailed description below of the embodiments of the present disclosure provided in the accompanying drawings is not intended to limit the scope of the present disclosure claimed, but merely illustrates chosen embodiments of the present disclosure. All of other embodiments obtained by those ordinarily skilled in the art based on the embodiments in the present disclosure without using creative efforts shall fall within the scope of protection of the present disclosure.

It should be noted that similar reference signs and letters represent similar items in the following accompanying drawings, therefore, once a certain item is defined in one accompanying drawing, it is not needed to be further defined or explained in subsequent accompanying drawings. Meanwhile, in the description of the present disclosure, terms such as "first" and "second" are merely for distinctive description, but should not be construed as indicating or implying importance in relativity.

It should be indicated that in the present text, relational terms such as first and second are merely for distinguishing one entity or operation from another entity or operation, while it is not required or implied that these entities or operations necessarily have any such practical relation or order. Moreover, terms "include", "contain" or any other derivatives thereof are intended to be non-exclusive, thus a process, method, article or device including a series of elements not only include those elements, but also include other elements that are not listed definitely, or further include elements inherent to such process, method, article or device. Without more restrictions, an element defined with wordings "include a . . . " does not exclude presence of other same elements in the process, method, article or device including said element.

In the description of the present disclosure, it should be indicated that orientation or positional relationships indicated by terms such as "upper", "lower", "inner", and "outer" are based on orientation or positional relationships as shown in the accompanying drawings, or orientation or positional relationships of a product of the present disclosure when being conventionally placed in use, merely for facilitating describing the present disclosure and simplifying the description, rather than indicating or suggesting that related devices or elements have to be in the specific orientation or configured and operated in a specific orientation, therefore, they should not be construed as limiting the present disclosure.

In the description of the present disclosure, it should be further illustrated that, unless otherwise specifically regulated and defined, the terms "provide" and "connect" should be understood in a broad sense, for example, a connection may be a fixed connection, a detachable connection, or an integrated connection; it may be a mechanical connection or an electrical connection; it may be direct connection or indirect connection through an intermediary, and it also may be inner communication between two elements. For those ordinarily skilled in the art, specific meanings of the above-mentioned terms in the present disclosure could be understood according to specific circumstances.

Optional embodiments of the present disclosure are described in detail below in combination with the accompanying drawings. The features in the following embodiments may be combined with each other without conflict.

In power electronic products, the driving circuit is an essential key part for the use of the fully-controlled semiconductor high-voltage power device, while the existing driving circuits generally have a larger volume and cannot effectively implement integration.

In view of this, the present disclosure provides a driving circuit. The integration of device is realized by growing at least two transistors on the same substrate, and further miniaturization of the driving circuit is realized.

Figure 20:
FIG. 20 is a module schematic diagram of the driving circuit provided in the present disclosure.

The driving circuit provided in the present disclosure is exemplarily described below:

As an optional implementation, referring to FIG. 1 and FIG. 20, the driving circuit includes a control module 100 and a driving signal output module 200, the control module 100 is electrically connected to the driving signal output module 200, and the driving signal output module 200 is electrically connected to a to-be-driven device, wherein the driving signal output module 200 includes at least two transistors, and the at least two transistors are epitaxially grown on the same substrate, and the control module 100 is configured to control a closed state of the at least two transistors, so as to control an operation state of the to-be-driven device.

With the manner of epitaxially growing the driving signal output module 200 on the same substrate, the miniaturization of the driving signal output module 200 can be realized, and further the miniaturization of the whole driving circuit is realized.

It may be understood that when it is required to control the to-be-driven device to start or stop operation, the control module 100 will send a corresponding control signal, and further achieves the effect of controlling the to-be-driven device by controlling the driving signal output module 200.

It should be noted that the to-be-driven device provided in the present disclosure may be a power transistor, and the number of the to-be-driven device in the present disclosure is also not limited, and may be one or two or three. It may be understood that an output end of the driving signal output module 200 is electrically connected to a gate of the power transistor, and further provides a driving signal for operation of the power transistor.

The driving signal output module 200 provided in the present disclosure is exemplarily described below.

In the above, the present disclosure does not limit the types of transistors used. For example, in the at least two transistors, all of the transistors may be N-type transistors, all of the transistors may also be P-type transistors, or some of the transistors may be N-type transistors, and some may be P-type transistors. Moreover, the transistors provided in the present disclosure are all normally-closed transistors.

Meanwhile, the present disclosure does not limit the kinds of the transistors either, for example, the transistor may be triode, MOS transistor (Metal Oxide Semiconductor Field Effect Transistor), or HEMT (High Electron Mobility Transistor), and HHMT (High Hole Mobility Transistor).

For example, when a part of the driving signal output module 200 is N-type transistor and a part is P-type transistor, as a possible implementation of the present disclosure, the at least two transistors include at least one N-type MOS transistor and at least one P-type MOS transistor, and the at least one N-type MOS transistor and the at least one P-type MOS transistor are both epitaxially grown on the same substrate; as another possible implementation of the present disclosure, the at least two transistors include at least one N-type triode and at least one P-type triode, and the at least one N-type triode and the at least one P-type triode are epitaxially grown on the same substrate; as another possible implementation of the present disclosure, the at least two transistors include at least one HEMT and at least one HHMT, and the at least one HEMT and the at least one HHMT are epitaxially grown on the same substrate.

Hereinafter, the driving signal output module 200 including at least one HEMT and at least one HHMT is taken as an example for illustration, wherein as the HEMT and the HHMT are of different conductivity types, the driving signal output module 200 may be regarded as a complementary type module.

Optionally, in the present disclosure, when at least one HEMT and at least one HHMT are epitaxially grown on the same substrate, a vertical interface may be included on the substrate, and the HEMT and the HHMT are respectively located at two sides of the vertical interface. By providing the HEMT and the HHMT at two sides of the vertical interface respectively, the integration of the HEMT and the HHMT may be realized, and the miniaturization is realized. Moreover, the growing process is simple, and the fabrication efficiency is high.

Figure 2:
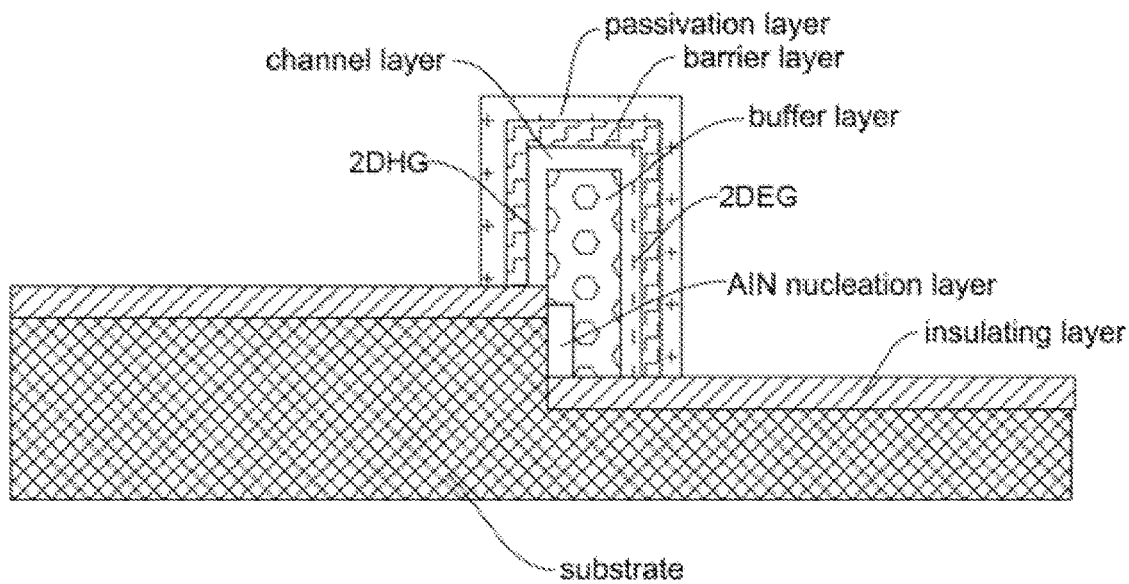
FIG. 2 is a structural schematic diagram of a driving signal output module provided in the present disclosure.

As an optional implementation, the growth of the HEMT and the HHMT may be realized by utilizing different crystal orientations of the vertical interface on the substrate. For example, referring to FIG. 2, at least one HEMT and at least one HHMT share a same channel layer and a same barrier layer, and the channel layer is provided at outside of the vertical interface, wherein an AlN nucleation layer and a buffer layer shown in FIG. 2 may serve as the vertical interface. The barrier layer is provided at outside of the channel layer, an interface between the channel layer and the barrier layer includes a first polar surface and a second polar surface, and the first polar surface and the second polar surface are respectively located at two sides of the vertical interface respectively, wherein the first polar surface is configured to provide a two-dimensional electron gas, and the second polar surface is configured to provide a two-dimensional hole gas, further forming the HHMT device on a left side of the vertical interface, and forming the HEMT device on a right side of the vertical interface. Optionally, it is also possible that the HEMT and the HHMT do not need to share the same channel layer or the same barrier layer, which is not limited in the present disclosure.

Illustration is made below with an optional specific preparation process.

First, in order to realize the fabrication of the HEMT and the HHMT at two sides of the vertical interface respectively, the substrate needs to be processed first to obtain a desired substrate structure. Taking a silicon substrate as an example, a (111) surface in a vertical direction may be obtained by anisotropic corrosion or the like on a (110) surface.

In the above, the present disclosure does not limit the material of the substrate, for example, the substrate may be selected from substrates with a (0001) surface having hexagonal symmetry, such as sapphire and 4H—SiC The substrate such as sapphire and 4H—SiC is a common growth surface of GaN material, thus higher GaN crystal quality may be obtained. Moreover, common surfaces perpendicular to the (0001) surface include m-surface (1-100), a-surface (11-20) and so on. Therefore, the (0001) surface in the vertical direction may be obtained on the substrate having these surfaces and becomes a growth surface of GaN-based epitaxial layer.

It should be noted that the above substrates are merely examples, and in practical applications, other substrates also may be used, for example, $Al_2O_3$, SiC or other substrate is adopted, as long as a surface having hexagonal symmetry, such as Si (111) surface, $Al_2O_3$ (0001) surface, and 4H—SiC (0001) surface, can be obtained on the surface perpendicular to the substrate, the device in the same structure may be realized.

It should be also noted that for the silicon substrate, due to the melt-back effect of Ga atoms, a nucleation layer such as AlN must be used. However, as the selective growth capability of the AlN is weaker, there may also be certain AlN grown on the insulating material, which has an adverse effect on the device. Therefore, a wafer may be taken out after the growth of the AlN is completed, and through etching having anisotropy, only the AlN nucleation layer on the vertical surface is retained but the AlN at other places is removed. For example, in a dry etching process of ion bombardment with vertical orientation, AlN on the vertical surface is subjected to weaker ion bombardment and the AlN on the other surfaces is subjected to stronger bombardment, in this way, it is possible to only retain the AlN on the vertical surface, to form the vertical interface on the substrate. Certainly, as the silicon (111) surface is easier to cause nucleation of AlN with respect to the amorphous insulating materials such as $SiO_2$ or SiN, the AlN may also realize nucleation and growth only on the vertical (111) silicon surface in a suitable growth process, but a process window is smaller.

In other materials such as $Al_2O_3$, GaN may be nucleated and grown on the $Al_2O_3$ (0001) surface, which may avoid the above problems.

Figure 3:
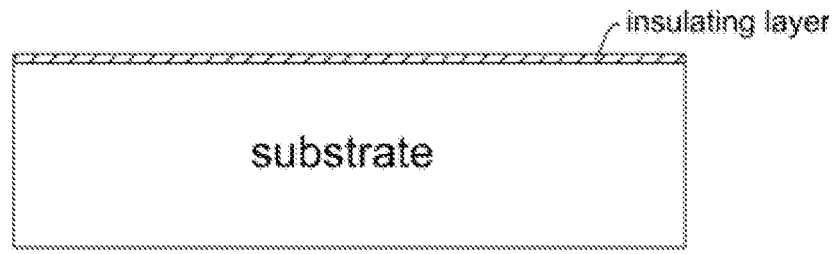
FIG. 3-FIG. 8 are corresponding structural schematic diagrams when processing a substrate, provided in the present disclosure.

In the above, taking the silicon substrate as an example, and referring to FIG. 3, before growing the AlN nucleation layer, the processing on the substrate comprise first etching to form on the substrate an elongated structure with a (111) surface, for example, forming an insulating layer on an upper surface of the substrate, wherein optionally, the insulating layer may be a $SiO_2$ layer formed by thermal oxidation or vapor deposition. Moreover, as an optional implementation, this insulating layer has a thickness of about 0.5 micrometers.

Figure 4:
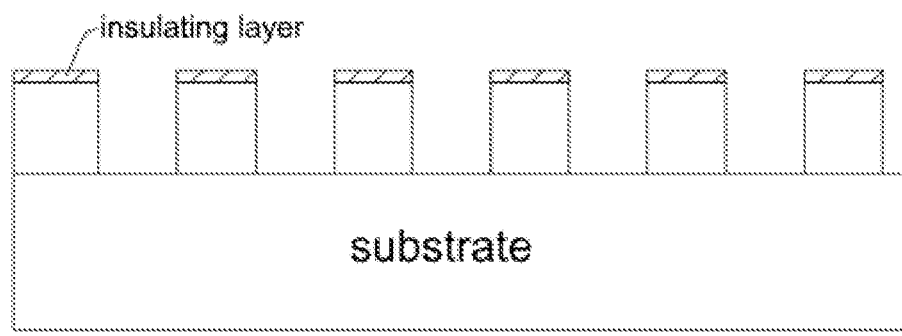

As shown in FIG. 4, the insulating layer is photolithographed with a mask, further forming insulating layers provided at intervals. Then, the substrate is etched, and due to the blocking of the insulating layers, the substrate located below the insulating layers will not be etched away, while regions where there is no insulating layer will be etched out to form grooves, further forming a plurality of vertical grooves arranged at intervals. In the above, a side wall of the groove has a hexagonal symmetrical lattice structure, for example, a (111) surface of Si.

Figure 5:
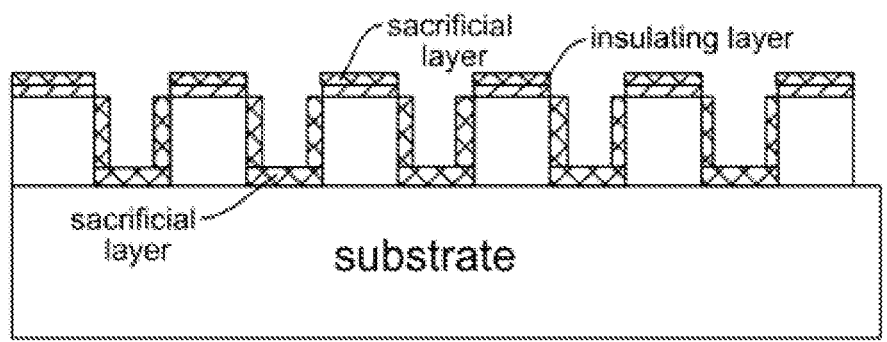
Figure 6:
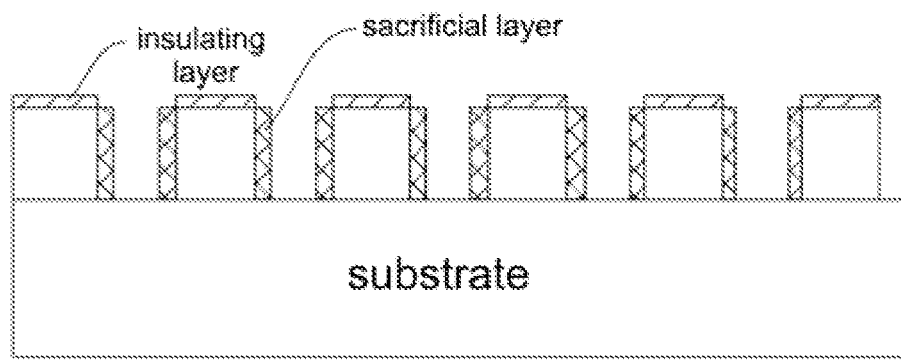

Then, referring to FIG. 5, a sacrificial layer is formed by deposition on the surface of the substrate, and at this time, surfaces of the insulating layers, surfaces of bottoms of the grooves, and surfaces of side walls of the grooves are all covered with the sacrificial layer. Optionally, the material of the sacrificial layer may be silicon nitride. Next, as shown in FIG. 6, dry etching is performed to remove the sacrificial layer on the surfaces of the insulating layers and on the surfaces of the bottoms of the grooves, while the sacrificial layer on the surfaces of the side walls of the grooves are retained.

Next, the insulating layers may be formed again on bottom surfaces of the grooves by an oxidation process, and the material of the insulating layer still may be $SiO_2$. In the above, the insulating layers fabricated on the surface of the substrate and the surfaces of the bottoms of the grooves may avoid incompatibility between the gallium atoms and the silicon substrate during subsequent growth of the nitride semiconductor, so as to avoid the melt-back phenomenon. Meanwhile, the insulating layers on the surfaces of the bottoms of the grooves further may effectively block a leakage current between the nitride semiconductor and the silicon substrate, and reduce a parasitic capacitance brought about by the silicon substrate.

Then, by selective wet corrosion, the sacrificial layers on side surfaces of the grooves are removed by utilizing an etching selection ratio of the sacrificial layer to the insulating layer.

It may be understood that in this case, the upper surface of the substrate and the surfaces of the bottoms of the grooves are each covered with the insulating layer, and as an implementation, the insulating layers on the upper surface of the substrate and on the surfaces of the bottoms of the grooves have the same thickness. Moreover, the side walls of the grooves are bare.

After realizing the above operations, a thin insulating layer may be formed on the side walls of the grooves through an oxidation process again, wherein the thicknesses of the insulating layers on the side walls of the grooves need to be smaller than the thicknesses of the insulating layers on the upper surface of the substrate and on the surfaces of the bottoms of the grooves. In this way, when subsequently removing the insulating layers on the side walls, the substrate is still protected by the insulating layers having a certain thickness on the bottom of the substrate and the surfaces of the bottoms of the grooves. These insulating layers may avoid incompatibility between the gallium atoms and the silicon substrate during subsequent growth of the nitride semiconductor, so as to avoid the occurrence of melt-back phenomenon, which are essential for fabricating the nitride semiconductor device on the silicon substrate.

Then, a part of the insulating layers on the side walls of the grooves are removed by an exposure and development process. It should be noted that when removing a part of the insulating layers on the side walls, the insulating layer on the upper surface of the substrate will be removed simultaneously, but as the thickness of the insulating layer on the upper surface of the substrate is much greater than the thicknesses of the insulating layers on the side walls of the grooves, only a certain thickness of the insulating layer on the upper surface of the substrate is etched, but is not completely removed.

Figure 7:
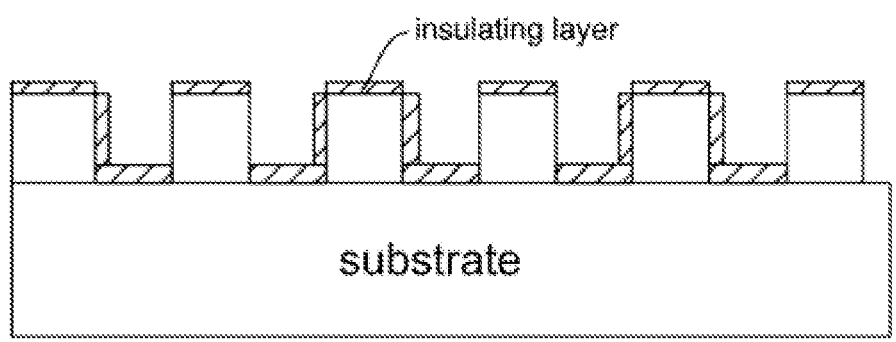
Figure 8:
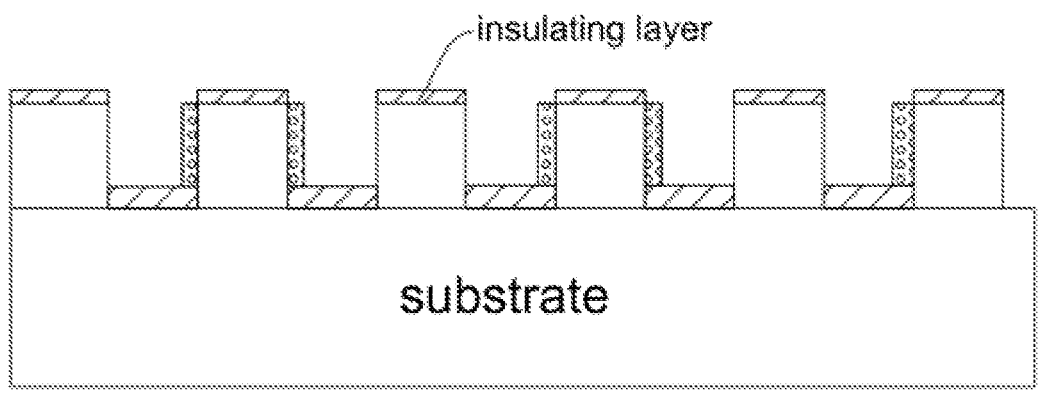

It may be understood that referring to FIG. 7, at this time, except that a part of the regions on the side walls of the grooves are not covered by the insulating layers, other positions are all covered by the insulating layers. Therefore, as shown in FIG. 8, when depositing the AlN nucleation layer on the silicon substrate, the AlN nucleation layer is only formed on a part of the regions on the side walls, and the single crystal AlN crystal has a growth direction of <0001>, and a surface being a (0001) surface.

It should be noted that if other substrates such as $Al_2O_3$ are used, the nucleation layer may also be GaN nucleation layer. In this case, it may be easier to realize through process adjustment that nucleation is performed only on the exposed substrate surface.

After the nucleation layer is formed, the AlN nucleation layer may be taken as a core to fabricate the driving signal output module of the present disclosure.

As an implementation, a first nitride semiconductor layer may be epitaxially grown laterally along the nucleation layer. It may be understood that due to the presence of the grooves, the first nitride semiconductor layer is filled in the grooves after growth. It may be understood that before growing the first nitride semiconductor layer, a buffer layer may be formed first by deposition, or it is also possible that the buffer layer is not formed.

In order to realize that the HEMT and HHMT devices provided in the present disclosure are normally-closed devices, in the present disclosure, at least one P-type doped region and/or N-type doped region may be formed in the first nitride semiconductor layer, thus depleting the two-dimensional carrier gas in the vicinity of the gate electrode. For example, the first nitride semiconductor layer is formed with at least one P-type doped region, which at least partially overlaps the gate electrode in a projection direction of <0001> crystal orientation, and is electrically coupled with the two-dimensional carrier gas, thus substantially depleting the two-dimensional carrier gas of a first conductivity type, so as to realize that the transistor is normally-closed.

On the basis of the above structure, the insulating layer on the surface of the substrate and a part of the substrate below the insulating layer may be taken out again, in this case, a groove structure still will be formed on the substrate. The second nitride semiconductor layer is then epitaxially grown. In the above, the first nitride semiconductor layer is a channel layer, and the second nitride semiconductor layer is a barrier layer. Finally, the electrode is fabricated to complete the fabrication of the driving signal output module of the present disclosure.

It may be understood that the crystal orientations at two sides of the vertical interface are (000-1) and (0001) respectively, and an opposite direction of (0001) is (000-1). In the (000-1) crystal orientation, the channel layer and the barrier layer will form 2DHG (two-dimensional hole gas). In the (0001) crystal orientation, the channel layer and the barrier layer will form 2DEG (two-dimensional electron gas). In the above, the HEMT device may be constituted by forming a source, a drain, and a gate at the 2DEG side; and an HHMT device may be constituted by forming a source, a drain, and a gate at the 2DHG side. In the above, the source and the drain should form good ohmic contact with the 2DEG or the 2DHG, that is, a smaller contact resistance is preferred. The gate needs to reduce the leakage current to the channel as much as possible: the gate and the barrier layer may be made to form Schottky contact with each other, or an insulating layer may be formed under the gate electrode to reduce the leakage current, that is, a gate insulating layer is formed before forming the gate electrode.

For the two devices HEMT and HHMT, the sources and the drains thereof generally may be made of the same material, but as the ohmic contact metal of the HEMT and the ohmic contact metal of the HHMT are generally different, materials of the source and drain of the HEMT and the source and drain of the HHMT are generally different. Since the requirements for work function are usually different, the gate material of the HEMT and the gate of the HHMT are also usually different.

The corresponding arrangement manner of the sources, the drains, and the gates of the HHMT and the HEMT in the present disclosure is merely for illustration, and there also may be many other relative positional relationships.

A fin structure thus formed has a vertical channel structure, and by increasing the height of the channel, an effective conduction area may be significantly increased, the conduction resistance (ON resistance) is reduced, and thus the production cost is reduced.

It should be noted that if the $Al_2O_3$ or SiC substrate is adopted, it is also possible that the above $SiO_2$ insulating layer is not required. This is mainly because that the Ga atoms are compatible with $Al_2O_3$ or SiC, and there is no melt-back phenomenon. Under suitable process conditions, it is easier to nucleate and grow on $Al_2O_3$ (0001) or SiC (0001) having hexagonal symmetry, therefore, such substrate having a vertical growth surface naturally has the selective growth capability. Certainly, if amorphous insulating layers such as SiO$_2$ and SiN insulating layers are still adopted, the process window of such selective growth is larger and more controllable.

Figure 9:
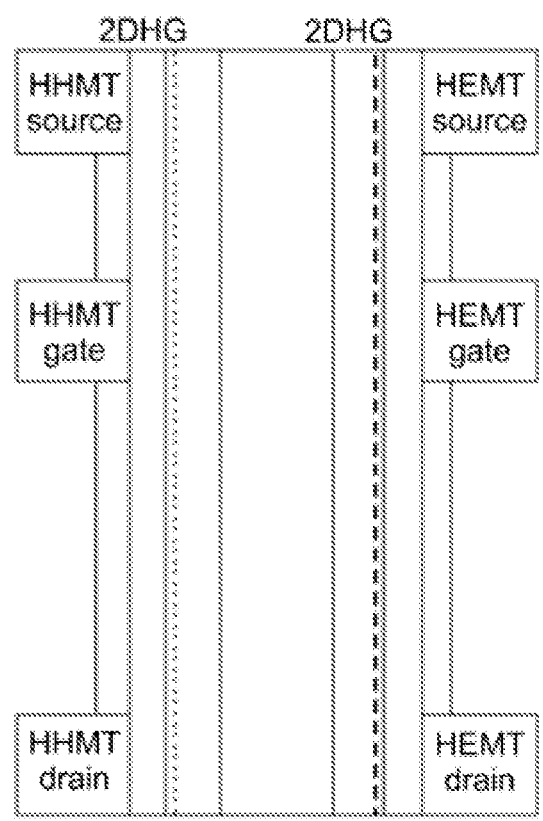
FIG. 9 is a sectional schematic diagram of the driving signal output module provided in the present disclosure.

FIG. 9 is a sectional schematic diagram for a case of preparing one HHMT and one HEMT at left and right sides of the vertical interface respectively, provided in the present disclosure. Certainly, it is also possible to merely fabricate either the HHMT or the HEMT, or fabricate a plurality of HHMTs and a plurality of HEMTs at two sides of the vertical interface.

Through the above preparation process, the HHMT and/or the HEMT can be grown on the same substrate, thus realizing the integration of device.

It should be noted that a material for fabricating the at least one HEMT and the at least one HHMT may be a group III nitride.

In the above, the operation state of the low voltage power device is mainly divided into three states, an off state, a switching state at the moment of being opened or closed, and an on state, and the operation frequency and the loss of the low voltage power device itself severely affect the power consumption and volume of the whole power electronic product.

The loss of the low voltage power device itself is divided into the loss in the on state and the loss in the switching state at the moment of being opened or closed. The conductive loss (i.e. the loss in the on state) is mainly related to the current and conduction resistance value Ron. When a large current is conducted, the conduction resistance value Ron is decreased mainly by increasing an effective area of a conduction area inside the device. The switching loss (i.e. the loss in the switching state at the moment of being opened or closed) is mainly related to the operation frequency and parasitic capacitance Cp of the device, and during high-frequency operation, the parasitic capacitance value Cp is decreased mainly by reducing an effective area of a bare band inside the device.

Since the main means for reducing the loss of the device in the above two states are contradictory, a product value of Ron and Cp is usually taken as an important performance indicator for evaluating the low voltage power device, and the product value of Ron and Cp is generally abbreviated as FOM (figure of merit) value of the low voltage power device. If the low voltage power device may operate in a high-frequency large-current state when having very low own loss, the whole power electronic circuit system may realize high-frequency operation. The volume of passive large-volume components such as inductors and transformers in the circuit may be exponentially reduced at high frequency, further realizing the low power consumption and volume miniaturization of the product.

Figure 10:
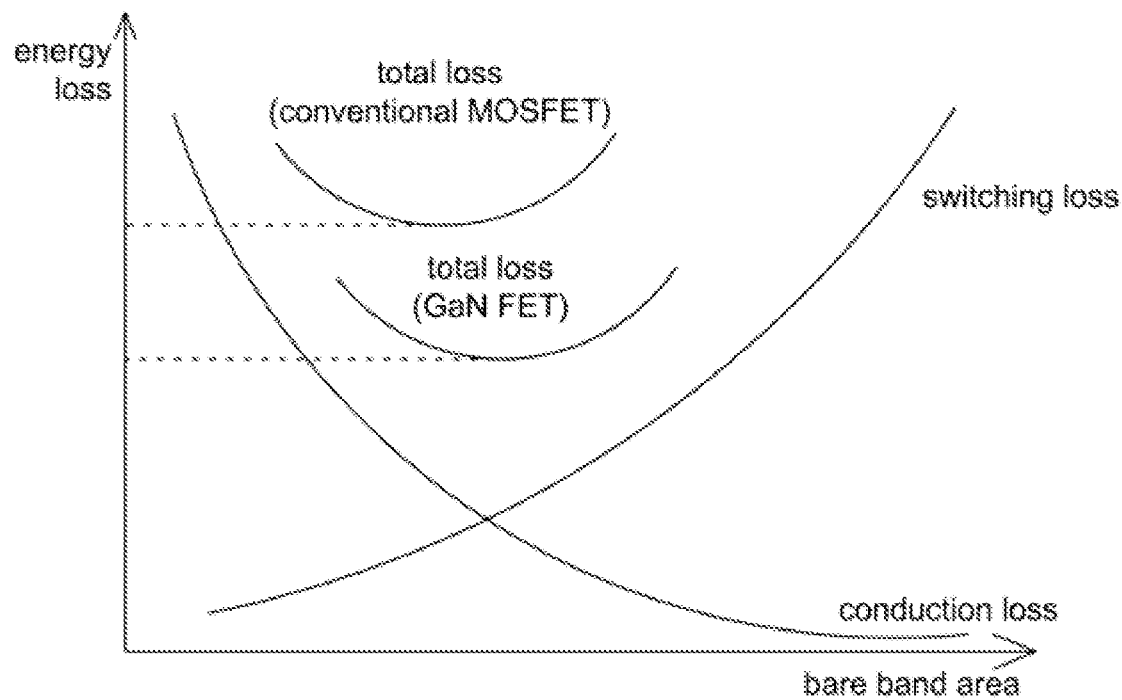
FIG. 10 is a schematic diagram of FOM value of a power device provided in the present disclosure.

As shown in FIG. 10, the present disclosure shows a schematic diagram of the FOM value of the power device, and it may be seen from the drawing that compared with the conventional Si material transistor, the ROM value of the transistor device adopting the group III nitride in the present disclosure is smaller. Moreover, by growing the HHMT and/or the HEMT on the same substrate, parasitic capacitance, inductance and so on may be further reduced, the operation frequency of the device may be increased and the loss may be reduced. In other words, the present disclosure realizes the effect of reducing the device loss by both improving the material and growing the HHMT and/or the HEMT on the same substrate.

Moreover, on the basis of the above preparation process, the driving signal output module 200 provided in the present disclosure may be fabricated. In the above, the driving circuit generally includes an isolation driving IC device and a non-isolation driving IC device, wherein the isolation driving IC device mainly includes an isolation single-output device and an isolation half-bridge output device, and the non-isolation driving IC device mainly includes a single-output device, a dual-output device, a multi-output device, and a half-bridge output device etc.

Figure 11:
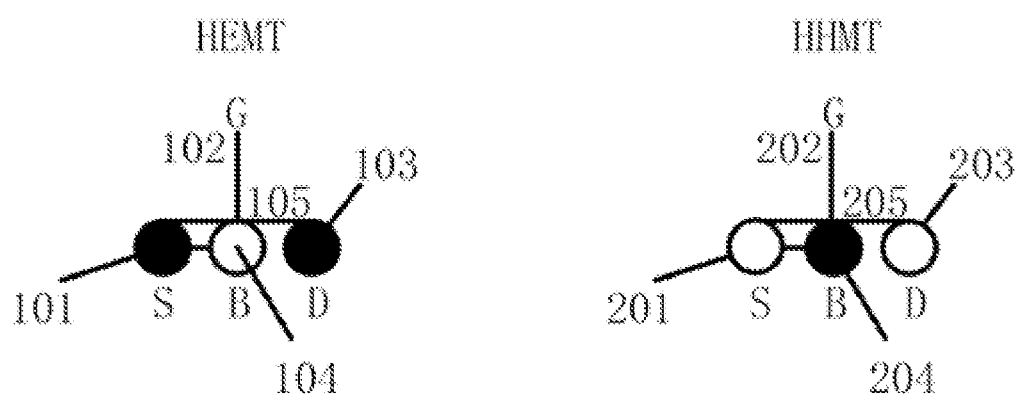
FIG. 11 is a schematic diagram of circuit symbols of power devices HEMT and HHMT provided in the present disclosure.

The present disclosure is described by taking a non-isolation driving IC device as an example. As a possible implementation, the driving signal output module 200 may include a single-phase half-bridge circuit, a two-phase half-bridge circuit, and a three-phase half-bridge circuit. It should be noted that FIG. 11 shows circuit symbols of high electron mobility transistor (HEMT) and high hole mobility transistor (HHMT). The HEMT includes a first source electrode 101, a first drain electrode 103, a first gate electrode 102, and a first body electrode 104, wherein a two-dimensional electron gas (2DEG) channel 105 is between the first source electrode 101 and the first drain electrode 103, and the solid sphere represents electron. The HHMT includes a second source electrode 201, a second drain electrode 203, a second gate electrode 202, and a second body electrode 204, wherein a two-dimensional hole gas (2DHG) channel 205 is between the second source electrode 201 and the second drain electrode 203, and the hollow sphere represents hole. The first gate electrode 102 and the second gate electrode 202 control opening and closing of conductive channels of the HEMT and the HHMT, respectively.

Figure 12:
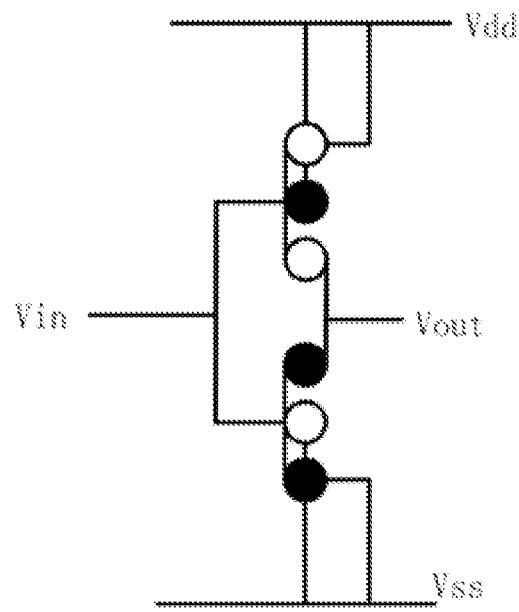
FIG. 12 is a circuit schematic diagram of a single-phase half-bridge circuit provided in the present disclosure.

Referring to FIG. 12, when the driving signal output module 200 includes a single-phase half-bridge circuit, the driving signal output module 200 includes a first HHMT and a first HEMT, drains of the first HHMT and the first HEMT are both connected to an output port, and the output port is configured to be electrically connected to the to-be-driven device.

When the driving signal output module 200 includes a two-phase half-bridge circuit, the driving signal output module 200 includes a first HHMT, a first HEMT, a second HHMT, and a second HEMT, and drains of the first HHMT, the second HHMT, the first HEMT, and the second HEMT are all connected to the output port.

When the driving signal output module 200 includes a three-phase half-bridge circuit, the driving signal output module 200 includes a first HHMT, a first HEMT, a second HHMT, a second HEMT, a third HHMT, and a third HEMT, and drains of the first HHMT, the first HEMT, the second HHMT, the second HEMT, the third HHMT, and the third HEMT are all connected to the output port.

Optionally, the output port includes a first output port and a second output port, and both the first output port and the second output port are electrically connected to the same to-be-driven device.

Figure 13:
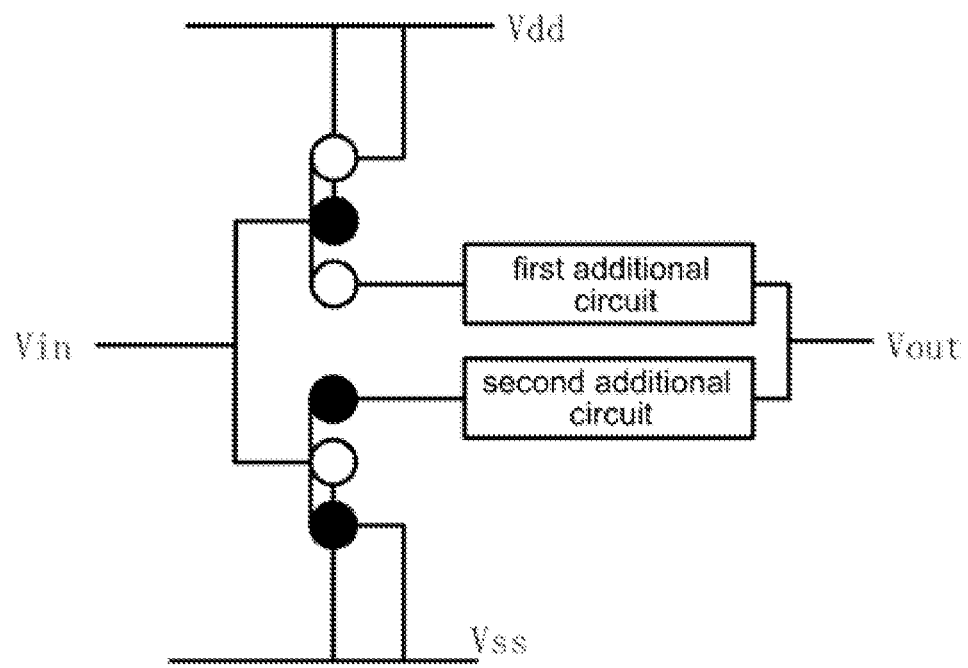
FIG. 13 is another circuit schematic diagram of the single-phase half-bridge circuit provided in the present disclosure.

Referring to FIG. 13, when the driving signal output module 200 includes a single-phase half-bridge circuit, the driving signal output module 200 further includes a first additional circuit and a second additional circuit. The drain of the first HHMT is electrically connected to the first output port through the first additional circuit. The drain of the first HEMT is electrically connected to the second output port through the second additional circuit. The first additional circuit and the second additional circuit regulate the on-time of the first HHMT and the first HEMT, respectively. As an implementation, the first additional circuit and the second additional circuit may include devices such as diode and capacitor, and further regulate and control the on-time of the HHMT. As another implementation, resistance values of the first additional circuit and the second additional circuit are different. By setting additional circuits with different resistance values, the on-time and the off-time of the device can be controlled. For example, when the resistance value of the first additional circuit is 100Ω, the on-time of the device needs to be 100 ms; and when the resistance value of the first additional circuit is 200Ω, the on-time of the device needs to be 200 ms. Meanwhile, on this basis, more additional circuits may also be provided, and the additional circuits are connected in parallel with the first additional circuit. Resistance values of the additional circuits are also different, so that when different devices are controlled to be conductive, the on-time of the additional circuits may be changed.

In the above, the first additional circuit and the second additional circuit in the present disclosure may be a resistor, or may be a circuit composed of a plurality of resistors connected in series or in parallel. Alternatively, the additional circuits may also be other energy consuming or non-energy consuming device, which is not limited in the present disclosure.

When the driving signal output module 200 includes a two-phase half-bridge circuit, the driving signal output module 200 further includes a third additional circuit and a fourth additional circuit. The drain of the first HHMT is electrically connected to the first output port through the first additional circuit. The drain of the second HHMT is electrically connected to the first output port through the third additional circuit. The drain of the first HEMT is electrically connected to the second output port through the second additional circuit. The drain of the second HEMT is electrically connected to the second output port through the fourth additional circuit. In the above, the third additional circuit and the fourth additional circuit have different resistance values. Likewise, the third additional circuit and the fourth additional circuit regulate and control the on-time of the second HHMT and the second HEMT, respectively.

When the driving signal output module 200 includes a three-phase half-bridge circuit, the driving signal output module 200 further includes a fifth additional circuit and a sixth additional circuit. The drain of the first HHMT is electrically connected to the first output port through the first additional circuit. The drain of the second HHMT is electrically connected to the first output port through the third additional circuit. The drain of the third HHMT is electrically connected to the first output port through the fifth additional circuit. The drain of the first HEMT is electrically connected to the second output port through the second additional circuit. The drain of the second HEMT is electrically connected to the second output port through the fourth additional circuit. The drain of the third HEMT is electrically connected to the second output port through the sixth additional circuit. In the above, the fifth additional circuit and the sixth additional circuit have different resistance values. Likewise, the fifth additional circuit and the sixth additional circuit regulate and control the on-time of the third HHMT and the third HEMT, respectively.

As another possible implementation of the present disclosure, the driving signal output module 200 may include a single-phase circuit, a two-phase circuit, and a three-phase circuit.

Figure 14:
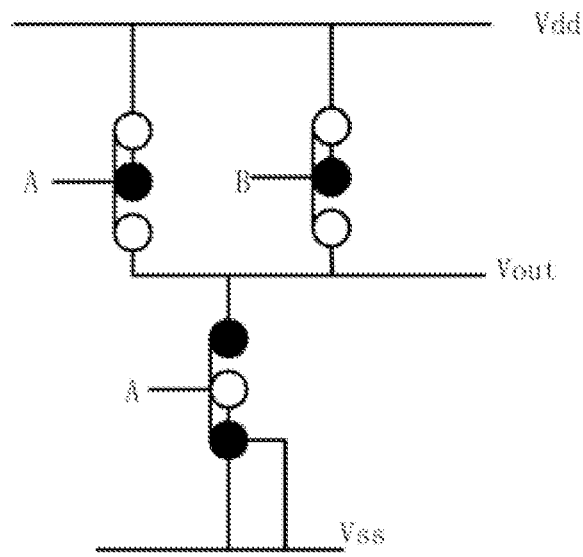
FIG. 14 is a circuit schematic diagram of a single-phase circuit provided in the present disclosure.

Referring to FIG. 14, when the driving signal output module 200 includes a single-phase circuit, the driving signal output module 200 includes a first HHMT, a first HEMT, and a fourth HHMT, wherein the first HHMT and the fourth HHMT are connected in parallel, and drains of the first HHMT, the fourth HHMT, and the first HEMT are all connected to the output port.

By providing the first HHMT and the fourth HHMT, the on-time and the off-time of the to-be-driven device also can be controlled. For example, when the to-be-driven device is controlled to be on, the first HHMT may be controlled to be conductive first to realize pre-start, and then the first HHMT and the fourth HHMT are controlled to be conductive simultaneously, further shortening the on-time of the to-be-driven device. By providing the parallel devices, the driving current may also be increased, which is particularly advantageous for the HHMT with a lower driving current.

Figure 15:
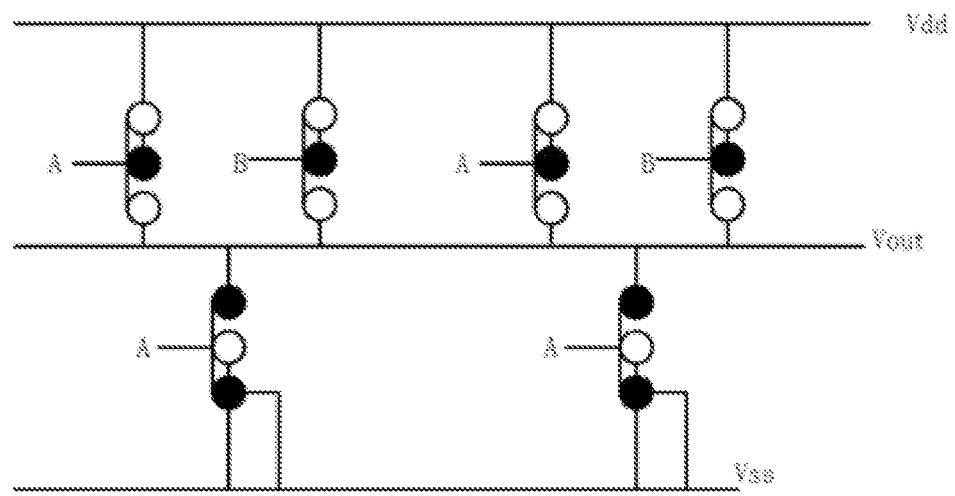
FIG. 15 is a circuit schematic diagram of a two-phase circuit provided in the present disclosure.

Referring to FIG. 15, when the driving signal output module 200 includes a two-phase circuit, the driving signal output module 200 includes a first HHMT, a first HEMT, a second HHMT, a second HEMT, a fourth HHMT, and a fifth HHMT. The first HHMT, the second HHMT, the fourth HHMT, and the fifth HHMT are connected in parallel, and drains of the first HHMT, the first HEMT, the second HHMT, the second HEMT, the fourth HHMT, and the fifth HHMT are all connected to the output port.

Figure 16:
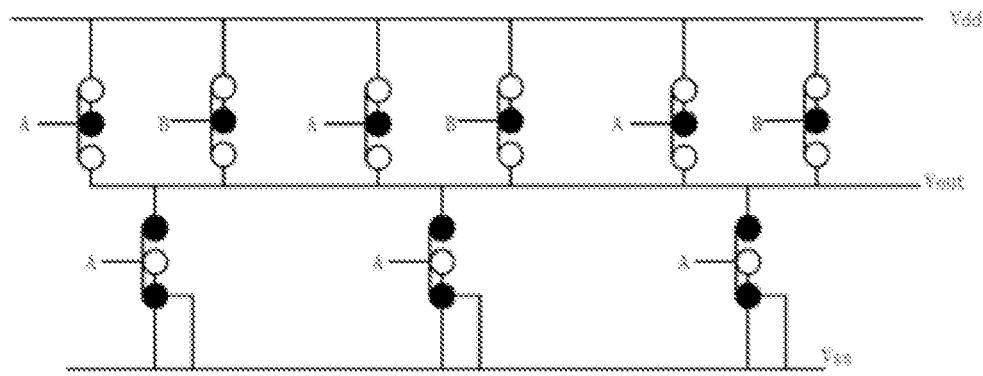
FIG. 16 is a circuit schematic diagram of a three-phase circuit provided in the present disclosure.

Referring to FIG. 16, when the driving signal output module 200 includes a three-phase circuit, the driving signal output module 200 includes a first HHMT, a first HEMT, a second HHMT, a second HEMT, a third HHMT, a third HEMT, a fourth HHMT, a fifth HHMT, and a sixth HHMT. The first HHMT, the second HHMT, the third HHMT, the fourth HHMT, the fifth HHMT, and the sixth HHMT are connected in parallel, and drains of the first HHMT, the first HEMT, the second HHMT, the second HEMT, the third HHMT, the third HEMT, the fourth HHMT, the fifth HHMT, and the sixth HHMT are all connected to the output port.

Figure 17:
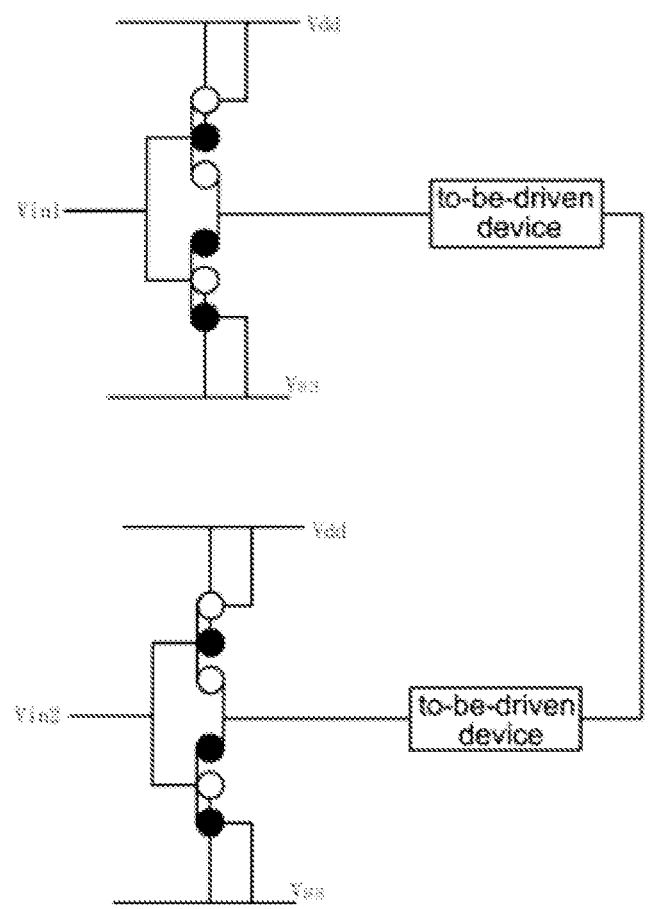
FIG. 17 is a circuit schematic diagram of a two-output half-bridge driving circuit provided in the present disclosure.

As another possible implementation of the present disclosure, referring to FIG. 17, the driving signal output module 200 includes a dual-output half-bridge driving circuit.

In the above, the driving signal output module 200 includes a first HHMT, a first HEMT, a second HHMT, and a second HEMT, drains of the first HHMT and the first HEMT are both connected to a first output port, and drains of the second HHMT and the second HHMT are connected to the second output port, and wherein the first output port is configured to be connected to a to-be-driven device, and the second output port is configured to be connected to another to-be-driven device.

Optionally, when the driving signal output module 200 includes a dual-output half-bridge driving circuit, two to-be-driven devices may constitute an upper half-bridge and a lower half-bridge, thus achieving the purpose of controlling the operation of the upper half-bridge and the lower half-bridge through the driving signal output module 200. Certainly, the number of input ports may be more, and further, more to-be-driven devices are driven, which is not limited in any way in the present disclosure.

It may be understood that when the driving signal output module 200 includes a plurality of devices, for example, in the above implementations, when the driving signal output module 200 includes the three-phase half-bridge circuit, three HHMT devices and three HEMT devices are required, which may be implemented by fabricating three HHMT devices at one side of the vertical interface of the substrate, and fabricating three HEMT devices at the other side of the vertical interface of the substrate.

Optionally, when a driving circuit is constructed with the driving signal output module 200, a non-isolation gate driving circuit may be fabricated, for example, a low-end gate driving circuit and a half-bridge gate driving circuit, or an isolation type driving circuit, for example, an isolation gate driving circuit, may be fabricated. In the above, the isolation gate driving circuit includes an isolation device, for example, a capacitor or other isolation device.

Figure 18:
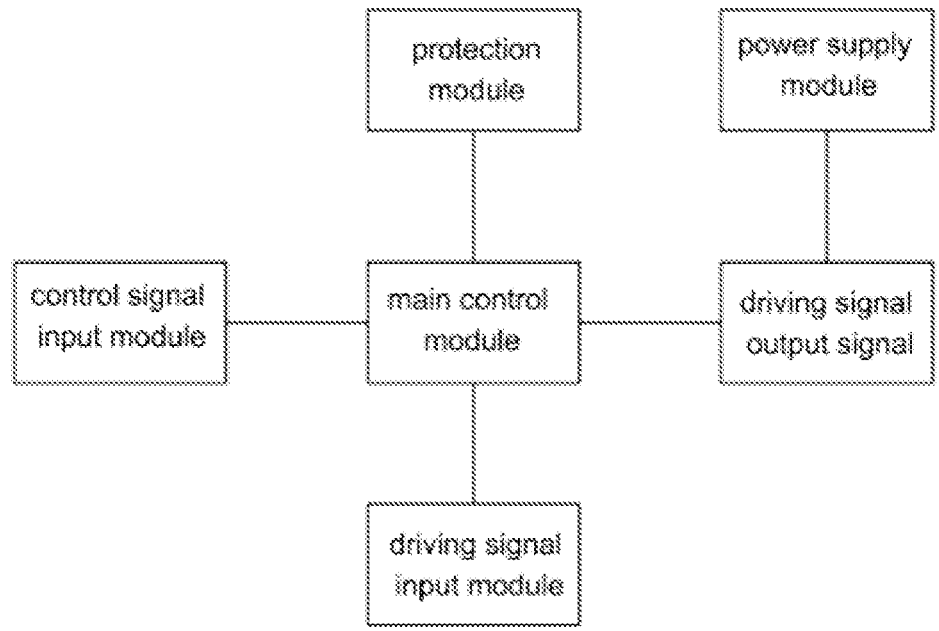
FIG. 18 is a module schematic diagram of a control module provided in the present disclosure.

As an optional implementation, referring to FIG. 18, the control module 100 includes a driving signal input module, a control signal input module, a power supply module, a protection module, and a main control module, wherein the power supply module is electrically connected to the driving signal output module 200; the driving signal input module, the control signal input module, and the protection module are all electrically connected to the main control module, and the main control module is electrically connected to the driving signal output module 200; the main control module is configured to control the off state of the driving signal output module 200 according to signals of the driving signal input module, the control signal input module, and the protection module.

Figure 19:
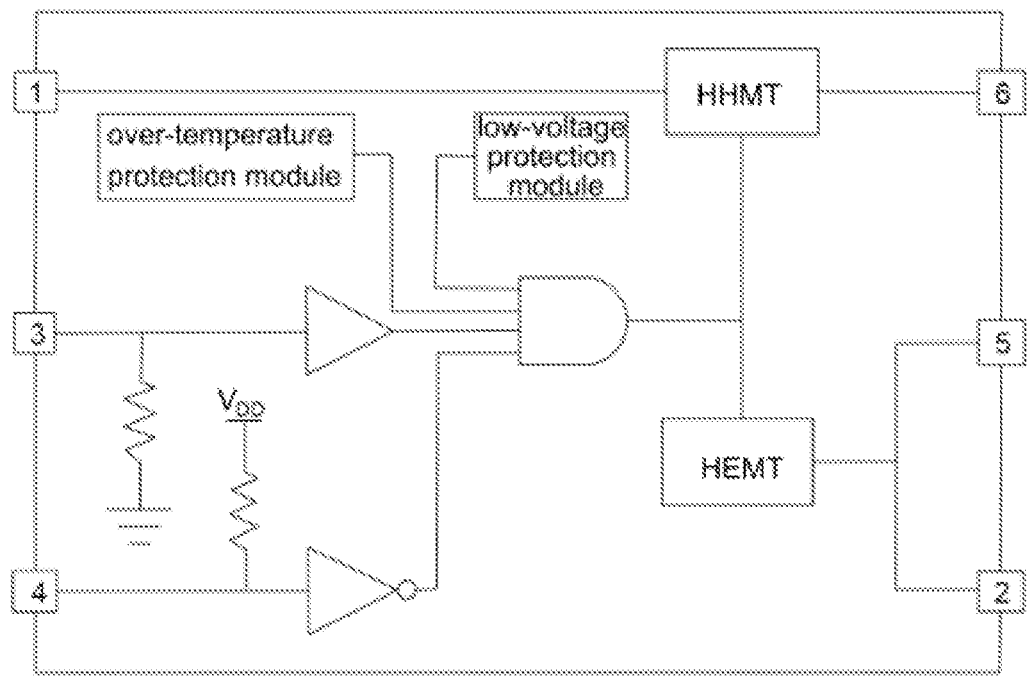
FIG. 19 is a circuit schematic diagram of the driving circuit provided in the present disclosure.

Taking FIG. 19 as an example for illustration, the main control module may be a circuit composed of an AND gate, a buffer gate, and a phase inverter, an output end of the AND gate may be electrically connected to the HEMT and the HHMT respectively, and an input end of the AND gate is electrically connected to the protection module, the control signal input module (not shown), and the driving signal input module, respectively. In the above, the driving signal input module may be electrically connected to a device such as controller, and configured to receive a corresponding control signal, and the control signal input module may be a device such as controller, and it is electrically connected to the AND gate, and configured to control the AND gate to start or stop operating. Moreover, the protection module provided in the present disclosure includes an over-temperature protection module and a low-voltage protection module, wherein the over-temperature protection module and the low-voltage protection module are both electrically connected with the AND gate, and input signals to the AND gate.

In other words, when the control signal input module, the driving signal input module, the over-temperature protection module, and the low-voltage protection module all output a high level (indicating that the driving circuit does not have an over-temperature or low-voltage condition), the AND gate controls the driving signal output module 200 to operate.

Meanwhile, the driving circuit provided in the present disclosure further may realize the integration of the control module 100 and the driving signal output module 200, and as the driving signal output module 200 has been integrated once, when the control module 100 and the driving signal output module 200 are integrated, the volume after the integration is smaller.

Based on the above contents, the present disclosure further provides a driving IC, wherein the driving IC includes at least two transistors, and the at least two transistors are epitaxially grown on the same substrate. The driving IC provided in the present disclosure can realize that the devices are integrated based on a unified substrate, and further can realize the miniaturization.

Moreover, based on the above contents, the present disclosure further provides a driving system including a to-be-driven device and the above driving circuit electrically connected to the to-be-driven device, wherein the driving circuit is configured to control an operation state of the to-be-driven device, and the to-be-driven device includes a nitride device.

Moreover, the driving circuit and the to-be-driven device are integrated on the same chip, and the miniaturization of the whole driving system can be realized by integrating the driving circuit and the to-be-driven device on the same chip.

To sum up, the present disclosure provides a driving circuit, a driving IC, and a driving system. The driving circuit includes a control module and a driving signal output module, the control module is electrically connected to the driving signal output module, and the driving signal output module is configured to be electrically connected to the to-be-driven device, wherein the driving signal output module includes at least two transistors, and the at least two transistors are epitaxially grown on the same substrate; and the control module is configured to control a closed state of the at least two transistors, so as to control the operation state of the to-be-driven device. As the transistors in the driving signal output module provided in the present disclosure are grown on the same substrate, it realizes integration, can make the driving circuit smaller, and realizes the objectives of miniaturization and improved the integration level.

Besides, the various functional modules in the present disclosure may be integrated together to form one independent portion, and it is also possible that the various modules exist independently, or that two or more modules are integrated to form one independent part.

The above-mentioned are merely preferred embodiments of the present disclosure and not used to limit the present disclosure. For one skilled in the art, various modifications and changes may be made to the present disclosure. Any modifications, equivalent substitutions, improvements and so on, within the spirit and principle of the present disclosure, should be covered within the scope of protection of the present disclosure.

For one skilled in the art, obviously, the present disclosure is not limited to details of the above exemplary embodiments, and without departing from the spirit or basic features of the present disclosure, the present disclosure could be implemented in other specific forms. Therefore, no matter from which point of view, the embodiments should be regarded as exemplary and non-limiting, the scope of the present disclosure is defined by the appended claims rather than the above description, therefore all changes falling within the meaning and scope of equivalents of the claims are intended to be covered within the present disclosure. Any reference signs in the claims should not be regarded as limiting the claims involved.

INDUSTRIAL APPLICABILITY

The present disclosure provides a driving circuit, a driving IC, and a driving system, and the driving circuit has a small volume and a high integration level.

The invention claimed is:

1. A driving circuit, wherein the driving circuit comprises a control module and a driving signal output module, the control module is electrically connected to the driving signal output module, and the driving signal output module is electrically connected to a to-be-driven device,
wherein the driving signal output module comprises at least two transistors, and the at least two transistors are epitaxially grown on the same substrate; and
the control module is configured to control a closed state of the at least two transistors, so as to control an operation state of the to-be-driven device,
wherein,
the at least two transistors comprise at least one P-type transistor and at least one N-type transistor;
the at least two transistors comprise at least one high electron mobility transistor (HEMT) and at least one high hole mobility transistor (HHMT), the substrate comprises a vertical interface, and the HEMT and the HHMT are located at two sides of the vertical interface respectively;

the at least one HEMT and the at least one HHMT each contain a channel layer and a barrier layer, the channel layer is provided outside the vertical interface, the barrier layer is provided outside the channel layer, an interface between the channel layer and the barrier layer comprises a first polar surface and a second polar surface, and the first polar surface and the second polar surface are located at two sides of the vertical interface respectively; and the first polar surface provides a two-dimensional electron gas, and the second polar surface provides a two-dimensional hole gas.

2. The driving circuit according to claim 1, wherein the driving signal output module comprises a single-phase half-bridge circuit, a two-phase half-bridge circuit, and a three-phase half-bridge circuit, wherein when the driving signal output module comprises the single-phase half-bridge circuit, the driving signal output module comprises a first HHMT and a first HEMT, drains of the first HHMT and the first HEMT are both connected to an output port, and the output port is electrically connected to the to-be-driven device;

when the driving signal output module comprises a two-phase half-bridge circuit, the driving signal output module comprises a first HHMT, a first HEMT, a second HHMT, and a second HEMT, and drains of the first HHMT, the second HHMT, the first HEMT, and the second HEMT are all connected to the output port; and when the driving signal output module comprises a three-phase half-bridge circuit, the driving signal output module comprises a first HHMT, a first HEMT, a second HHMT, a second HEMT, a third HHMT, and a third HEMT, and drains of the first HHMT, the first HEMT, the second HHMT, the second HEMT, the third HHMT, and the third HEMT are all connected to the output port.

3. The driving circuit according to claim 2, wherein the output port comprises a first output port and a second output port, and both the first output port and the second output port are electrically connected to the same to-be-driven device;

when the driving signal output module comprises a single-phase half-bridge circuit, the driving signal output module further comprises a first additional circuit and a second additional circuit, the drain of the first HHMT is electrically connected to the first output port through the first additional circuit, and the drain of the first HEMT is electrically connected to the second output port through the second additional circuit, so that on-time of the first HHMT and the first HEMT is regulated and controlled through the first additional circuit and the second additional circuit, respectively;

when the driving signal output module comprises the two-phase half-bridge circuit, the driving signal output module further comprises a third additional circuit and a fourth additional circuit, the drain of the first HHMT is electrically connected to the first output port through the first additional circuit, the drain of the second HHMT is electrically connected to the first output port through the third additional circuit, the drain of the first HEMT is electrically connected to the second output port through the second additional circuit, and the drain of the second HEMT is electrically connected to the second output port through the fourth additional circuit, so that on-time of the second HHMT and the second HEMT is regulated and controlled through the third additional circuit and the fourth additional circuit, respectively; and when the driving signal output module comprises the three-phase half-bridge circuit, the driving signal output module further comprises a fifth additional circuit and a sixth additional circuit, the drain of the first HHMT is electrically connected to the first output port through the first additional circuit, the drain of the second HHMT is electrically connected to the first output port through the third additional circuit, the drain of the third HHMT is electrically connected to the first output port through the fifth additional circuit, the drain of the first HEMT is electrically connected to the second output port through the second additional circuit, the drain of the second HEMT is electrically connected to the second output port through the fourth additional circuit, and the drain of the third HEMT is electrically connected to the second output port through the sixth additional circuit, so that on-time of the third HHMT and the third HEMT is regulated and controlled through the fifth additional circuit and the sixth additional circuit, respectively.

4. The driving circuit according to claim 3, wherein the first additional circuit and the second additional circuit have different resistance values, the third additional circuit and the fourth additional circuit have different resistance values, and the fifth additional circuit and the sixth additional circuit have different resistance values.

5. The driving circuit according to claim 1, wherein the driving signal output module comprises a single-phase circuit, a two-phase circuit, and a three-phase circuit, wherein when the driving signal output module comprises the single-phase circuit, the driving signal output module comprises a first HHMT, a first HEMT, and a fourth HHMT, wherein the first HHMT is connected in parallel with the fourth HHMT, and drains of the first HHMT, the fourth HHMT, and the first HHMT are all connected to the output port;

when the driving signal output module comprises the two-phase circuit, the driving signal output module comprises a first HHMT, a first HEMT, a second HHMT, a second HEMT, a fourth HHMT, and a fifth HHMT, wherein the first HHMT, the second HHMT, the fourth HHMT, and the fifth HHMT are connected in parallel, and drains of the first HHMT, the first HEMT, the second HHMT, the second HEMT, the fourth HHMT, and the fifth HHMT are all connected to the output port;

when the driving signal output module comprises the three-phase circuit, the driving signal output module comprises a first HHMT, a first HEMT, a second HHMT, a second HEMT, a third HHMT, a third HEMT, a fourth HHMT, a fifth HHMT, and a sixth HHMT, wherein the first HHMT, the second HHMT, the third HHMT, the fourth HHMT, the fifth HHMT, and the sixth HHMT are connected in parallel, and drains of the first HHMT, the first HEMT, the second HHMT, the second HEMT, the third HHMT, the third HEMT, the fourth HHMT, the fifth HHMT, and the sixth HHMT are all connected to the output port.

6. The driving circuit according to claim 1, wherein the driving signal output module comprises a dual-output half-bridge driving circuit,
wherein the driving signal output module comprises a first HHMT, a first HEMT, a second HHMT, and a second HEMT, wherein drains of the first HHMT and the first HEMT are both connected to a first output port, and drains of the second HHMT and the second HEMT are connected to the second output port, and wherein the first output port is configured to be connected to a to-be-driven device, and the second output port is configured to be connected to another to-be-driven device.

7. The driving circuit according to claim 1, wherein materials for fabricating the at least one HEMT and the at least one HHMT comprise a group III nitride.

8. The driving circuit according to claim 1, wherein the at least two transistors are both normally-closed transistors.

9. The driving circuit according to claim 1, wherein the at least two transistors comprise at least one N-type triode and at least one P-type triode;
or the at least two transistors comprise at least one N-type MOS transistor and at least one P-type MOS transistor.

10. The driving circuit according to claim 1, wherein the control module comprises a driving signal input module, a control signal input module, a power supply module, a protection module, and a main control module,
wherein
the power supply module is electrically connected to the driving signal output module; the driving signal input module, the control signal input module, and the protection module are all electrically connected to the main control module, and the main control module is electrically connected to the driving signal output module; and
the main control module is configured to control a closed state of the driving signal output module according to signals of the driving signal input module, the control signal input module, and the protection module.

11. A driving system, wherein the driving system comprises a to-be-driven device and the driving circuit according to claim 1, and the driving circuit is electrically connected to the to-be-driven device,
wherein the driving circuit is configured to control an operation state of the to-be-driven device, and the to-be-driven device comprises a nitride device.

12. The driving system according to claim 11, wherein the driving circuit and the to-be-driven device are integrated on a same chip.

13. The driving circuit according to claim 1, wherein the at least two transistors are both normally-closed transistors.

14. The driving circuit according to claim 1, wherein the at least two transistors comprise at least one N-type triode and at least one P-type triode;
or the at least two transistors comprise at least one N-type MOS transistor and at least one P-type MOS transistor.

15. The driving circuit according to claim 1, wherein the control module comprises a driving signal input module, a control signal input module, a power supply module, a protection module, and a main control module,
wherein
the power supply module is electrically connected to the driving signal output module; the driving signal input module, the control signal input module, and the protection module are all electrically connected to the main control module, and the main control module is electrically connected to the driving signal output module; and
the main control module is configured to control a closed state of the driving signal output module according to signals of the driving signal input module, the control signal input module, and the protection module.

16. The driving circuit according to claim 1, wherein the at least two transistors comprise at least one N-type triode and at least one P-type triode;
or the at least two transistors comprise at least one N-type MOS transistor and at least one P-type MOS transistor.

* * * * *